US012581628B2

(12) United States Patent
Nishihara et al.

(10) Patent No.: US 12,581,628 B2
(45) Date of Patent: Mar. 17, 2026

(54) ELECTROMAGNETIC INTERFERENCE SUPPRESSING MATERIAL

(71) Applicants: KYOCERA Corporation, Kyoto (JP); TOHOKU UNIVERSITY, Sendai (JP)

(72) Inventors: Hirotomo Nishihara, Sendai (JP); Shigeyoshi Yoshida, Sendai (JP); Ken Uchida, Tokyo (JP)

(73) Assignees: KYOCERA CORPORATION, Kyoto (JP); TOHOKU UNIVERSITY, Sendai (JP)

( * ) Notice: Subject to any disclaimer, the term of this patent is extended or adjusted under 35 U.S.C. 154(b) by 22 days.

(21) Appl. No.: 18/724,835

(22) PCT Filed: Dec. 26, 2022

(86) PCT No.: PCT/JP2022/048036

§ 371 (c)(1),
(2) Date: Jun. 27, 2024

(87) PCT Pub. No.: WO2023/127834

PCT Pub. Date: Jul. 6, 2023

(65) Prior Publication Data

US 2025/0071960 A1 Feb. 27, 2025

(30) Foreign Application Priority Data

Dec. 28, 2021 (JP) ................................ 2021-215112

(51) Int. Cl.

*H05K 9/00* (2006.01)
*H01F 1/26* (2006.01)
*H01F 1/37* (2006.01)

(52) U.S. Cl.

CPC ............. *H05K 9/0083* (2013.01); *H01F 1/26* (2013.01); *H01F 1/37* (2013.01); *H05K 9/0075* (2013.01)

(58) Field of Classification Search

CPC .................................................... H05K 9/0083
See application file for complete search history.

(56) References Cited

U.S. PATENT DOCUMENTS

| | | | | |
|---|---|---|---|---|
| 5,627,541 A * | 5/1997 | Haley | .................... | H01Q 17/00 342/4 |
| 5,668,070 A * | 9/1997 | Hong | .................... | C04B 35/265 501/126 |
| 6,284,363 B1 * | 9/2001 | Maeda | .................. | H01Q 17/00 442/377 |
| 2005/0030218 A1 | 2/2005 | Kondo et al. | | |

FOREIGN PATENT DOCUMENTS

| | | | |
|---|---|---|---|
| JP | 2001-68889 | A | 3/2001 |
| JP | 2005-57093 | A | 3/2005 |
| JP | 2005-268363 | A | 9/2005 |
| JP | 2011-195756 | A | 10/2011 |
| JP | 2012-209515 | A | 10/2012 |
| JP | 2014-043357 | A | 3/2014 |
| JP | 2016-17086 | A | 2/2016 |
| JP | 5894612 | B2 | 3/2016 |
| JP | 2016-108214 | A | 6/2016 |
| JP | 2018-67715 | A | 4/2018 |

* cited by examiner

*Primary Examiner* — Hung V Ngo
(74) *Attorney, Agent, or Firm* — Volpe Koenig

(57) ABSTRACT

An electromagnetic interference suppressing material includes: a base material containing at least one selected from the group consisting of an organic substance and an inorganic substance; and a carbon composite material. The carbon composite material includes at least one selected from the group consisting of a core-shell particle and a core-shell connected body, where the core-shell particle includes an inorganic particle in which a surface of the inorganic particle is coated with a coating layer composed of graphene having an average number of layers of 4 or less, and the core-shell connected body includes a connected body of inorganic particles in which a surface of the connected body of inorganic particles is coated with a coating layer of graphene having an average number of layers of 4 or less, and the electromagnetic interference suppressing material has a volume resistance of $10^3$ Ω·cm or more.

10 Claims, No Drawings

ELECTROMAGNETIC INTERFERENCE SUPPRESSING MATERIAL

TECHNICAL FIELD

The present disclosure relates to an electromagnetic interference suppressing material.

BACKGROUND OF INVENTION

In recent years, various measures have been taken for the purpose of reducing electromagnetic failure including malfunction of a device due to electromagnetic noises, information leakage, and reduction in information communication speed due to interference. As a means for reducing electromagnetic failure, a method for blocking electromagnetic waves by reflection, or a method for absorbing electromagnetic waves has been proposed.

For example, Patent Document 1 proposes an electromagnetic wave shielding material obtained by dispersing a soft magnetic metal powder such as a powder of a metal selected from Fe, Ni, Co, and V or an alloy of two or more of these metals in a rubber or plastic matrix and molding the resultant product into a sheet shape. Patent Document 2 proposes a sheet-shaped radio wave absorber in which a radio wave absorbing layer formed of a radio wave absorbing material obtained by dispersing silicon carbide powder in a matrix resin is layered on a surface of a metal body. Patent Document 3 proposes, for example, an electromagnetic wave absorbing sheet in a frequency band of from 5 to 7 GHz, having a dielectric layer formed of a matrix containing a carbon material, a divided conductive film layer layered on one surface of the dielectric layer, and an electromagnetic wave reflecting layer layered on the other surface of the dielectric layer.

CITATION LIST

Patent Literature

Patent Document 1: JP 2001-68889 A
Patent Document 2: JP 2005-57093 A
Patent Document 3: JP 2012-209515 A

SUMMARY

Problem to be Solved

Many proposals have been made for the purpose of reducing electromagnetic failure, such as the electromagnetic wave shielding material, the radio wave absorber, and the electromagnetic wave absorbing sheet described in Patent Documents 1 to 3. However, with recent improvement in performance and diversification of communication devices, electromagnetic failure may not be sufficiently reduced, and further improvement has been required.

In addition, the method for blocking electromagnetic waves by reflection using a metal or the like has an issue of inevitably involving autointoxication.

The present disclosure has been made in view of such circumstances, and an object thereof is to provide an electromagnetic interference suppressing material having good electromagnetic wave absorption performance and electromagnetic interference suppression performance, and having electromagnetic failure reduction performance.

Solution to Problem

As a result of intensive studies to solve the above-described issue, the present inventors have found that an electromagnetic interference suppressing material including a base material including an organic substance and/or an inorganic substance and a predetermined carbon composite material has high electromagnetic wave absorption performance and electromagnetic interference suppression performance, and has further electromagnetic failure reduction performance.

The present disclosure has been completed based on such a finding.

That is, the present disclosure relates to the following.

[1] An electromagnetic interference suppressing material including: a base material including at least one selected from the group consisting of an organic substance and an inorganic substance; and a carbon composite material, in which the carbon composite material includes at least one selected from the group consisting of a core-shell particle and a core-shell connected body, the core-shell particle including an inorganic particle in which a surface of the inorganic particle is coated with a coating layer composed of graphene having an average number of layers of 4 or less, and the core-shell connected body including a connected body of inorganic particles in which a surface of the connected body of inorganic particles is coated with a coating layer of graphene having an average number of layers of 4 or less, and the electromagnetic interference suppressing material has a volume resistance of $10^3$ Ω·cm or more.

[2] The electromagnetic interference suppressing material according to [1], in which an average particle diameter of the inorganic particle contained in the core-shell particle and the inorganic particles contained in the core-shell connected body is 100 μm or less.

[3] The electromagnetic interference suppressing material according to [1] or [2], in which a graphene content in the electromagnetic interference suppressing material is from 0.001 to 30 mass % with respect to a total amount of the electromagnetic interference suppressing material.

[4] The electromagnetic interference suppressing material according to any of [1] to [3], in which the inorganic particle contained in the core-shell particle and the inorganic particles contained in the core-shell connected body contain at least one selected from the group consisting of alumina, silica, magnesium oxide, tungsten carbide, and aluminum nitride.

[5] The electromagnetic interference suppressing material according to any of [1] to [3], in which the inorganic particle contained in the core-shell particle and the inorganic particles contained in the core-shell connected body are magnetic bodies.

[6] The electromagnetic interference suppressing material according to [5], in which the magnetic bodies include at least one selected from the group consisting of a magnetic metal, a magnetic metal alloy, and a magnetic oxide, in which the magnetic oxide is at least one selected from the group consisting of ferrite and magnetite.

[7] The electromagnetic interference suppressing material according to [6], in which the magnetic metal and the magnetic metal alloy have a flat shape.

[8] The electromagnetic interference suppressing material according to any of [1] to [7], in which the organic substance is a thermosetting resin.

[9] The electromagnetic interference suppressing material according to any of [1] to [7], in which the organic substance is a thermoplastic resin.

[10] The electromagnetic interference suppressing material according to [1] to [9], in which the inorganic substance is a ceramic.

Advantageous Effect

The present disclosure can provide an electromagnetic interference suppressing material having high electromagnetic wave absorption performance and electromagnetic interference suppression performance, and having further electromagnetic failure reduction performance.

DESCRIPTION OF EMBODIMENTS

Hereinafter, the present disclosure will be described in detail with reference to an embodiment.

In the present description, wording of "from XX to YY" refers to "XX or greater and YY or less". In the present description, with regard to numerical ranges (e.g., ranges such as content), lower and upper limit values described in a stepwise manner may each be independently combined. In a numerical range described herein, the upper or lower limit value of the numerical range may be replaced by a value presented in the Examples.

In the present specification, the term "electromagnetic interference suppressing material" refers to a material capable of attenuating a near electromagnetic field and electromagnetic waves by using loss properties (magnetic loss, dielectric loss, electric resistance, and the like).

Note that in the present specification, the term "graphene" means a "sheet-shaped substance of $sp^2$-bonded carbon atoms having 10 or fewer layers".

In the present specification, the "average number of layers" of graphene is a value obtained by the following formula. Specifically, it is obtained by a method which will be described in the Examples below.

Average number of layers of graphene=amount of carbon supported per area ($g/m^2$)/(mass of graphene per area [$g/m^2$])

The "amount of carbon supported per area ($g/m^2$)" is a value obtained by dividing the amount (g) of carbon supported of the carbon composite material per mass as determined by thermogravimetric analysis by the specific surface area ($m^2/g$) of the inorganic particle contained in the core-shell particle or the inorganic particles contained in the core-shell connected body. Specifically, the amount (g) of carbon supported of the carbon composite material per mass as determined by thermogravimetric analysis is specifically determined by the method which will be described in the Examples.

The specific surface area refers to a BET specific surface area, and is a value obtained by measurement by a BET multipoint method (for example, from 5 to 6 points) by nitrogen adsorption.

In the present specification, "volume resistance" refers to volume resistivity, and can be measured in accordance with JIS K-6911:2006, and specifically can be measured by the method which will be described in the Examples.

[Electromagnetic Interference Suppressing Material]

An electromagnetic interference suppressing material according to the present disclosure includes a base material including an organic substance and/or an inorganic substance, and a carbon composite material. The carbon composite material is at least one selected from the group consisting of a core-shell particle and a core-shell connected body, the core-shell particle including an inorganic particle in which a surface of the inorganic particle is coated with a coating layer composed of graphene having an average number of layers of 4 or less, and the core-shell connected body including a connected body of inorganic particles in which a surface of the connected body of inorganic particles is coated with a coating layer of graphene having an average number of layers of 4 or less, and the electromagnetic interference suppressing material has a volume resistance of $1.0\times10^3$ Ω·cm or more.

When the carbon composite material is at least one selected from the group consisting of a core-shell particle and a core-shell connected body, the core-shell particle including an inorganic particle in which a surface of the inorganic particle is coated with a coating layer composed of graphene having an average number of layers of 4 or less, and the core-shell connected body including a connected body of inorganic particles in which a surface of the connected body of inorganic particles is coated with a coating layer of graphene having an average number of layers of 4 or less, the obtained electromagnetic interference suppressing material has high electromagnetic wave absorption performance and electromagnetic interference suppression performance, and has further electromagnetic failure reduction performance. The reason for this is not clear, but is considered as follows.

In the carbon composite material of the present disclosure, the surface of the inorganic particle is coated with a coating layer composed of graphene having an average number of layers of 4 or less. In other words, in the carbon composite material of the present disclosure, the surface of the inorganic particle (core) is configured with a graphene sheet (shell) having an average number of three dimensionally continuous layers of 4 or less. Therefore, the carbon composite material has a large specific surface area and a high radio wave absorption performance per unit area as a carbon composite material. With the large specific surface area, the carbon composite material of the present disclosure can improve the volume resistance, as compared with a case where the same amount of a different carbon composite material is contained. With the large specific surface area and the volume resistance improvement effect, it is considered that the carbon composite material of the present disclosure has high electromagnetic wave absorption performance and electromagnetic interference suppression performance.

The coating layer of the core-shell particle and the coating layer of the core-shell connected body may be composed of graphene. From the viewpoint of increasing the specific surface area of the carbon composite material and further improving the electromagnetic wave absorption performance and the electromagnetic interference suppression performance, the average number of layers of graphene may be less than 4, 3 or less, 2.5 or less, 2.0 or less, or 1.9 or less.

The electromagnetic interference suppressing material of the present disclosure has a volume resistance of $1.0\times10^3$ Ω·cm or more.

An electromagnetic interference suppressing material is generally said to be difficult to have insulation property, electromagnetic absorption performance, and electromagnetic interference suppression performance at the same time. However, the electromagnetic interference suppressing material of the present disclosure includes the carbon composite material, and thus has high insulation property (volume resistivity) and high electromagnetic wave absorption performance and electromagnetic interference suppression performance.

In an aspect of the present disclosure, the electromagnetic interference suppressing material may have a volume resistance of $10^6$ Ω·cm or more, $10^8$ Ω·cm or more, or $10^{10}$ Ω·cm or more from the viewpoint of ensuring the insulation property. The upper limit is not particularly defined, but may be equal to or less than $1.0\times10^{16}$ Ωcm.

Since some communication devices generate a large amount of heat, a heat radiating mechanism using a heat radiating sheet or the like is generally required. If the electromagnetic interference suppressing material not only reduces electromagnetic failure but also has high thermal conductivity and heat dissipation property, there is no need to use another mechanism such as a heat dissipation sheet in combination. It is useful because the number of assembling steps can be reduced in addition to reduction in size and weight of an electronic component. From such a viewpoint, the thermal conductivity of the electromagnetic interference suppressing material may be from 0.1 to 10.0 W/m·K, from 0.5 to 8.0 W/m·K, or from 1.0 to 6.0 W/m·K. The thermal conductivity can be determined by a hot-wire method in which a temperature gradient when heat flow energy is given by a hot wire is compared with that of a sample having a known thermal conductivity, a laser flash method in which high energy is instantaneously given to a homogeneous substance by a laser or the like and the thermal conductivity is calculated based on a thermal diffusivity and a specific heat measured at that time, or the like. Specifically, the oxidation degree can be measured by the method described in the Examples.

Communication devices have been reduced in size and weight and are required for packaging materials using an electromagnetic interference suppressing material. For example, some packages of a module-type electronic component may have an asymmetric thin shape and a large area. In a packaging process in which electronic components on a large-sized substrate represented by FOWLP (Fan Out Wafer Level Package) are collectively sealed on one side thereof and then singulated, warpage must be reduced. In such a case, it is useful to bring the thermal expansion of the electromagnetic interference suppressing material as close as possible to that of an insert having a low thermal expansion coefficient, that is, to lower the thermal expansion of the electromagnetic interference suppressing material. From such a viewpoint, a thermal expansion rate (α1: thermal expansion coefficient in a period from ambient temperature (25° C.) to glass transition temperature) of the electromagnetic interference suppressing material may be 1 ppm/deg. or more, or may be 3 ppm/deg. or more. The thermal expansion rate of the electromagnetic interference suppressing material may be 40 ppm/deg. or less or 35 ppm/deg. or less. When the electromagnetic interference suppressing material is used as a sealing material, the thermal expansion rate of the electromagnetic interference suppressing material may be 22 ppm/deg. or less or 20 ppm/deg. or less.

The thermal expansion coefficient can be determined from a slope of a tangent line at from 25 to 60° C. in a thermal mechanical analysis (TMA) chart obtained by measurement by TMA. Specifically, the oxidation degree can be measured by the method described in the Examples.

<Carbon Composite Material>

The carbon composite material of the present disclosure is a core-shell particle and/or a core-shell connected body, the core-shell particle contains an inorganic particle in which a surface of the inorganic particle is coated with a coating layer composed of graphene having an average number of layers of 4 or less, and the core-shell connected body contains a connected body of inorganic particles in which a surface of the connected body of inorganic particles is coated with a coating layer of graphene having an average number of layers of 4 or less.

The carbon composite material of the present disclosure includes those in which an inside of pores of the inorganic particles is coated with carbon and those in which an inside of pores of the inorganic particles is filled with carbon.

An average particle diameter of the core-shell particles may be from 0.0005 to 100 μm, from 0.1 to 50 μm, or from 0.5 to 20 μm from the viewpoint of further improving ease of production as well as the electromagnetic wave absorption performance and the electromagnetic interference suppression performance.

The average particle diameter of the core-shell particles is a value obtained by the following formula on the assumption that the pores are cylindrical pores:

Average particle diameter (m) of core-shell particles=6/[specific surface area ($m^2$/g)×true density (g/$m^3$) of core-shell particles]

The specific surface area refers to a BET specific surface area, and is a value obtained by measurement by a BET multipoint method (for example, from 5 to 6 points) by nitrogen adsorption.

An average particle diameter of the core-shell connected bodies may be from 0.0005 to 100 μm, from 0.1 to 50 μm, or from 0.5 to 20 μm from the viewpoint of further improving the ease of production as well as the electromagnetic wave absorption performance and the electromagnetic interference suppression performance.

The average particle diameter of the core-shell connected bodies can be estimated by using a laser diffraction-size particle size distribution meter.

An average particle diameter of the carbon composite materials may be 100 μm or less from the viewpoint of further improving the electromagnetic wave absorption performance and the electromagnetic interference suppression performance. In the present specification, the phrase "average particle diameter of the carbon composite materials" refers to an average particle diameter of primary particles when the carbon composite materials are not aggregated and are primary particles and refers to an average particle diameter of secondary particles when the carbon composite materials are aggregated and form secondary particles.

The average particle diameter of the carbon composite materials is a value calculated from the pore volume and the specific surface area, estimated with a laser diffraction-type particle size distribution meter, or calculated as a mean value of the particle diameters of particles observed in from 20 to 100 fields of view using an observation means such as a scanning electron microscope (SEM) or a transmission electron microscope (TEM). The term "particle diameter" refers to the maximum distance among distances between any two points on the contour of a particle, which pass through the center of the particle.

The specific surface area of the carbon composite material may be 800 $m^2$/g or less, 780 $m^2$/g or less, or 600 $m^2$/g or less from the viewpoint of further improving the electromagnetic wave absorption performance and the electromagnetic interference suppression performance. The lower limit is not particularly limited, but may be 1 $m^2$/g or more, 5 $m^2$/g or more, or 10 $m^2$/g or more.

The specific surface area refers to a BET specific surface area, and is a value measured by a BET multipoint method by nitrogen adsorption.

In the present disclosure, a carbon composite material content (mass %) in the electromagnetic interference suppressing material is not particularly limited because it greatly varies depending on the application and the base material. The carbon composite material content (mass %) in the electromagnetic interference suppressing material may be from 0.1 to 90 mass %, from 0.5 to 35 mass %, or from 1 to 30 mass % with respect to the total amount of the electromagnetic interference suppressing material from the viewpoint of further improving the electromagnetic wave absorption performance and the electromagnetic interference suppression performance.

[Inorganic Particle]

The core-shell particle and the core-shell connected body of the present disclosure contain an inorganic particle. The inorganic particle contained in the core-shell particle and the inorganic particles contained in the core-shell connected body (hereinafter, also collectively referred to as "inorganic particles") are not particularly limited. Examples of the inorganic particles include inorganic particles such as alumina, silica, magnesium oxide, tungsten carbide, aluminum nitride, cerium oxide, titanium oxide, and calcium carbonate; magnetic bodies which are magnetic metals such as pure iron; magnetic bodies which are magnetic metal alloys such as amorphous magnetic metal alloys, Ni—Fe-based alloys, mild steel, silicon steel (Fe—Si alloys), Fe—Al alloys, Fe—Si—Al alloys (sendust), and Co—Fe-based alloys; and magnetic bodies which are magnetic oxides such as carbonyl iron, magnetite, and ferrite.

Specific examples of the ferrite include Mn—Zn-based ferrite, Ni—Zn-based ferrite, Cu—Zn-based ferrite, Cu—Zn—Mg ferrite, Mn—Mg—Al ferrite, Y-type hexagonal ferrite, Z-type hexagonal ferrite, and M-type hexagonal ferrite.

The magnetic metal and the magnetic metal alloy may have a flat shape.

The inorganic particles may be selected depending on the application of the electromagnetic interference suppressing material.

The inorganic particles may contain at least one selected from the group consisting of alumina, silica, magnesium oxide, tungsten carbide, and aluminum nitride, may contain at least one selected from the group consisting of alumina, silica, and magnesium oxide, or may contain alumina, from the viewpoint of improving the volume resistance.

In addition, the inorganic particles may contain silica from the viewpoint of the thermal expansion rate.

Further, from the viewpoint of the thermal conductivity, the inorganic particles may contain one selected from the group consisting of alumina, magnesium oxide, and aluminum nitride, or may contain alumina.

In addition, the inorganic particles may be magnetic bodies, and the magnetic bodies may include at least one selected from the group consisting of a magnetic metal, a magnetic metal alloy, and a magnetic oxide, may include an amorphous magnetic metal alloy, may include at least one selected from the group consisting of an Fe—Si—Al alloy (sendust), ferrite, and magnetite, or may include ferrite and/or magnetite, from the viewpoint of improving the electromagnetic wave absorption ability in a wide frequency range as well as improving the thermal conductivity.

The inorganic particles may be composed of only one type of inorganic particles, or may include two or more types thereof.

The inorganic particles may be nanoparticles from the viewpoint of further improving the electromagnetic wave absorption performance and the electromagnetic interference suppression performance.

[Graphene]

The graphene of the present disclosure is a sheet-shaped substance having a hexagonal lattice structure in which carbon atoms are bonded. Graphene may be in a single-layer state having a layer thickness corresponding to one carbon atom, or in a multi-layer state having two or more layers. Graphene may contain an oxygen atom, a hydrogen atom, a boron atom, a nitrogen atom, a sulfur atom, a phosphorus atom, or the like in addition to the carbon atom.

The graphene content (mass %) in the core-shell particle and the core-shell connected body are not particularly limited. From the viewpoint of further improving the electromagnetic wave absorption performance and the electromagnetic interference suppression performance, the content may be from 0.1 to 70 mass %, from 0.5 to 45 mass %, or from 1 to 20 mass %.

A graphene content (mass %) in the electromagnetic interference suppressing material is not particularly limited. From the viewpoint of further improving the electromagnetic wave absorption performance and the electromagnetic interference suppression performance, the content may be from 0.001 to 30 mass %, from 0.01 to 20 mass %, or from 0.05 to 15 mass %.

<Base Material>

The base material of the present disclosure contains an organic substance and/or an inorganic substance. The base material may contain only an organic substance, only an inorganic substance, or both an organic substance and an inorganic substance.

[Organic Substance]

The organic substance contained in the base material is not particularly limited, and examples thereof include a thermosetting resin and a thermoplastic resin.

Examples of the thermosetting resins include epoxy resins, phenolic resins, and imide resins. Examples of the thermoplastic resin include polyolefinic resins, vinyl-based resins, styrene-acrylic resins, ethylene-acrylic acid ester resins, ethylene-methacrylic acid ester resins, diene-based resins, terpene resins, petroleum resins, cellulosic resins, polyamide resins, polyurethane resins, polyester resins, polycarbonate resins, polyimide resins, and fluororesins.

The organic substance may be a thermosetting resin from the viewpoint of the reliability of the molded body using the electromagnetic interference suppressing material, and may be an epoxy resin or an imide resin from the viewpoint of electrical insulation property and heat resistance of the molded body using the electromagnetic interference suppressing material. From the viewpoint of ease of production and ease of processing, a thermoplastic resin may be used. From the viewpoint of durability and weather resistance, a polyurethane may be used, and, in the case of being used outdoors, a polycarbonate-based polyurethane having good hydrolysis resistance may be used. The molded body refers to a mold produced by placing a product in a mold such as a template or a metal mold.

One type of the organic substance may be used, or two or more types may be used in combination.

In the present disclosure, the epoxy resin used as the organic substance has two or more epoxy groups per molecule, and the molecular structure, molecular weight, and the like are not particularly limited as long as the epoxy resin is one that is commonly used in electronic components.

Examples of the epoxy resin include aliphatic epoxy resins, such as phenol novolac-type epoxy resins, cresol novolac-type epoxy resins, and dicyclopentadiene derivatives; and aromatic epoxy resins, such as biphenyl-type, biphenyl aralkyl-type, naphthyl-type, and bisphenol-type epoxy resins. A single type of these epoxy resins may be used, or two or more may be mixed and used. The properties of the epoxy resin are also not particularly limited, and the epoxy resin may be either a liquid or a solid at ambient temperature (25° C.). For example, the epoxy resin may be a solid cresol novolac-type epoxy resin. The solid cresol novolac-type epoxy resin can be obtained as a commercially available product, and examples thereof include N670 (available from DIC Corporation). For example, the epoxy resin may be a liquid epoxy resin, and specific examples thereof include a bisphenol A-type epoxy resin and a bisphenol F-type epoxy resin. The liquid epoxy resin may be a the liquid epoxy resin including the bisphenol A skeleton includes Rikaresin BEO-60E (available from New Japan Chemical Co., Ltd.) expressed by the following general formula (1). An example of a commercially available product of the polyethylene glycol diglycidyl ether includes Epolite 400E (available from Kyoeisha Chemical Co., Ltd.), which contains a compound represented by the following general formula (2) as a main constituent.

[Chem. 1]

(1)

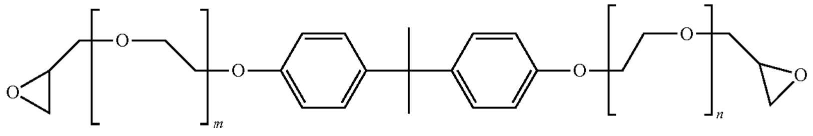

m + n = 6

[Chem. 2]

(2)

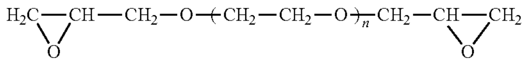

n ≒ 9 liquid bisphenol A-type epoxy resin. The liquid bisphenol A-type epoxy resin is commercially available, such as, for example, EPOMIK (trade name) R140 (available from Mitsui Chemicals, Inc.).

Note that in the present disclosure, the liquid epoxy resin refers to an epoxy resin that is in a liquid form at 25° C.

An epoxy equivalent weight of the epoxy resin may be 140 or more from the viewpoint of thermal mechanical properties of the molded body. From the viewpoint of the electromagnetic wave absorption performance, the epoxy equivalent weight may be 200 or more. The upper limit value of the epoxy equivalent weight may be 400 or less, or may be 380 or less from the viewpoint of the thermal mechanical nature.

The epoxy resin may include a polyoxyalkylene structure represented by (R1O)m and a polyoxyalkylene structure represented by (R2O)n.

Here, $R^1$ and $R^2$ each independently represent an alkylene group having one or more carbons. m+n may be from 1 to 50, or may be from 1 to 20. m may be from 0 to 49, or may be from 0 to 19. n may be from 1 to 50, or may be from 1 to 20.

Examples of the alkylene groups represented by $R^1$ and $R^2$ include a C1-6 alkylene group, and specifically include a methylene group, an ethylene group, a trimethylene group, a propylene group, a tetramethylene group, and a hexamethylene group. From the viewpoint of the electromagnetic wave absorption performance, each of the alkylene groups may be a methylene group or an ethylene group.

Of the quantity m of the $R^1O$ groups, the plurality of $R^1$ may all be the same alkylene group, or may be alkylene groups with different numbers of carbons. Of the quantity n of the $R^2O$ groups, the plurality of $R^2$ may all be the same alkylene group, or may be alkylene groups with different numbers of carbons.

Examples of the epoxy resin including the polyoxyalkylene structure include liquid epoxy resins including a bisphenol A skeleton, and polyethylene glycol diglycidyl ether. An example of a commercially available product of In the present disclosure, an example of the imide resin used as the organic substance include bis-allyl nadi-imide. Bis-allyl nadi-imide can be procured as a commercially available product, including, for example, BANI-M (available from Maruzen Petrochemical Co., Ltd.) and BANI-X (available from Maruzen Petrochemical Co., Ltd.).

In the present disclosure, an organic substance content (mass %) in the electromagnetic interference suppressing material may be from 0.1 to 40 mass %, from 1 to 30 mass %, from 3 to 25 mass %, or from 5 to 20 mass % with respect to the total amount of the electromagnetic interference suppressing material from the viewpoint of further improving the electromagnetic wave absorption performance and the electromagnetic interference suppression performance.

When a thermosetting resin is contained as the organic substance, the electromagnetic interference suppressing material of the present disclosure may further contain a curing agent, a curing accelerator, and the like.

Examples of the curing agent include aliphatic amines, aromatic amines, dicyandiamides, dihydrazide compounds, acid anhydrides, and phenolic resins. One type of these resins may be used, or two or more types may be used in combination. 1 Examples of the curing accelerator include organic peroxides such as dicumyl peroxide and dibutyl peroxide; imidazole compounds such as 2-methylimidazole and 2-ethylimidazole; organophosphorus-based compounds such as trimethylphosphine, triethylphosphine, tributylphosphine and triphenylphosphine; diazabicycloalkene compounds such as 1,8-diazabicyclo[5,4,0]undecene-7 (DBU) and 1,5-diazabicyclo(4,3,0)nonene-5; and tetraphenylboron-based compounds such as 2-ethyl-4-methylimidazole tetraphenylborate. One type of these resins may be used, or two or more types may be used in combination. In an aspect of the present disclosure, when the electromagnetic interference suppressing material of the present disclosure contains a curing agent, a content thereof may be from 0 to 150 mass %, from 0 to 120 mass %, or from 0 to 100 mass % with respect to 100 mass % of the thermosetting resin.

In another aspect of the present disclosure, when the electromagnetic interference suppressing material of the present disclosure contains a curing agent, a content thereof may be from 1 to 20 mass %, from 2 to 18 mass %, or from 3 to 15 mass % with respect to the total amount of the electromagnetic interference suppressing material.

When the electromagnetic interference suppressing material of the present disclosure contains a curing accelerator, a content thereof may be from 0.01 to 10 mass %, from 0.05 to 5 mass %, or from 0.1 to 3 mass % with respect to the total amount of the electromagnetic interference suppressing material.

The electromagnetic interference suppressing material of the present disclosure may further include a dispersion aid. The dispersion aid is not particularly limited as long as it is a material for stably and highly dispersing fine particles in a matrix resin. As a dispersant, a surfactant having functional groups with different reactivity in a single molecule, a coupling agent, and the like are generally used. Examples of the dispersion aid include surfactants, which include anionic surfactants such as carboxylates, and cationic surfactants such as quaternary ammonium salts; coupling agents having an amine-based functional group and a sulfide-based functional group, and cellulose nanofibers.

The cellulose nanofibers are bipolar minute solids and improve the dispersibility of a filler through a surface-active action. The cellulose nanofibers may be already highly dispersed in a liquid such as water or a thermosetting resin oligomer.

From the perspectives of workability and fluidity, the average fiber length of the cellulose nanofibers may be from 1 μm to 100 μm, or from 5 μm to 50 μm.

The average fiber diameter of the cellulose nanofibers, including aggregates, may be from 1 nm to 1000 nm, or from 4 nm to 500 nm. When the average fiber diameter is in the above range, the dispersibility of the carbon composite material can be increased, and, as a result, the electromagnetic interference suppression performance can be further improved.

Note that the average fiber length and the average fiber diameter of the cellulose nanofibers can be measured using a scanning electron microscope (SEM) through the same operation used to obtain the average fiber length and average fiber diameter of the carbon nanotubes described above.

Examples of commercially available products of the coupling agent having an amine-based functional group and a sulfide-based functional group include SUMILINK (trade name) 100 (available from Sumitomo Chemical Co., Ltd.). Examples of commercially available products of the cellulose nanofibers include ELLEX-S (available from Oji Paper Co., Ltd.).

When the electromagnetic interference suppressing material of the present disclosure includes the dispersion aid, a content thereof may be from 0.1 to 30 mass %, from 0.2 to 10 mass %, or from 0.3 to 5 mass % with respect to the total amount of the electromagnetic interference suppressing material from the viewpoint of the dispersibility and retention of thermomechanical properties.

In addition to each of the components described above, the electromagnetic interference suppressing material of the present disclosure can be compounded, as necessary, with additives generally blended in this type of electromagnetic interference suppressing material without departing from the gist of the present disclosure, examples of the additives including release agents, such as synthetic waxes, natural waxes, higher fatty acids, and esters of higher fatty acids; colorants, such as cobalt blue; modifiers, such as silicone oil or silicone rubber; hydrotalcites; ion scavengers; electrostatic charge-controlling agents; and flame retardants such as phosphazene. One type of these additives may be used, or two or more types may be mixed and used.

A content of these additives in the electromagnetic interference suppressing material of the present disclosure may be from 0.05 to 30 mass % or from 0.2 to 20 mass % as a total amount of the additives with respect to the total amount of the electromagnetic interference suppressing material.

[Inorganic Substance]

The inorganic substance contained in the base material is not particularly limited, as long as it is an inorganic substance used in electronic components, and examples thereof include inorganic substances (A) and inorganic substances (B) which will be described below.

One type of these resins may be used, or two or more types may be used in combination.

(Inorganic Substance (A))

The inorganic substance (A) is at least one selected from the group consisting of: inorganic fillers such as silica, alumina, magnesium oxide, titanium oxide, barium titanate, silicon nitride, aluminum nitride, silicon carbide and tungsten carbide; and soft magnetic materials such as amorphous magnetic metal alloys, Ni—Fe-based alloys, pure iron, mild steel, silicon steel (Fe—Si alloys), Fe—Al alloys, Fe—Si—Al alloys, Co—Fe-based alloys, carbonyl iron; and magnetic bodies including magnetic oxides such as magnetite and ferrite and is an inorganic substance other than the inorganic substance (B) which will be described later.

The inorganic substance (A) may be used together with the organic substance. From the viewpoint of reducing the expansion coefficient and/or increasing the thermal conductivity of the electromagnetic interference suppressing material, silica and/or alumina may be used, or silica may be used. In addition, from the viewpoint of further improving the electromagnetic wave absorption performance and the electromagnetic interference suppression performance, ferrite and/or amorphous magnetic metal alloys may be used.

A shape of the inorganic substance (A) is not particularly limited, and examples thereof include a spherical shape, a flake shape, and a fibrous shape. The shape of the inorganic substance may be a spherical shape or a shape other than the spherical shape.

An average particle diameter of the inorganic substance (A) is not particularly limited, and may be from 0.1 μm to 100 μm, from 0.2 μm to 75 μm, or from 0.2 μm to 50 μm.

Note that in the present specification, the average particle diameter is the volume average particle size, and the average particle size of the inorganic substance (A) can be calculated as an average value of the long diameter of the particles, measured using a laser diffraction-type device for measuring the particle size distribution.

When the inorganic substance (A) is contained in the electromagnetic interference suppressing material of the present disclosure, a content thereof may be from 20 to 95 mass %, from 30 to 90 mass %, or from 35 to 85 mass % with respect to the total amount of the electromagnetic interference suppressing material from the viewpoint of further improving the electromagnetic wave absorption performance and the electromagnetic interference suppression performance.

When the electromagnetic interference suppressing material of the present disclosure is used as a semiconductor sealing material, metal foreign matter is removed in the process of producing the semiconductor sealing material. When the metal foreign matter is removed using a magnet, the magnetic body is considered to be foreign matter and is removed, and thus the yield is poor. From such a perspective, when the electromagnetic interference suppressing material of the present disclosure is used as a semiconductor sealing material, a content of the magnetic body may be 1 mass % or less, 0.5 mass % or less, or 0 mass % or less with respect to the total amount of the electromagnetic interference suppressing material. Since specific gravity of the magnetic body is large, the content of the magnetic body may be equal to or less than the above-described values from the perspective of weight reduction of the resulting molded body.

(Inorganic Substance (B))

The inorganic substance (B) is a ceramic.

Specific examples of the ceramic include, but are not limited to, sintered bodies containing a metal oxide, nitride, carbide, or the like as a main component.

Specific examples of the metal oxide include alumina, zirconia, and magnesium oxide. Specific examples of the metal nitride include aluminum nitride, boron nitride, and silicon nitride.

Specific examples of the metal carbide include silicon carbide and boron carbide.

The ceramic may be a sintered body of alumina and/or aluminum nitride.

[Method for Producing Carbon Composite Material]

Hereinafter, an embodiment of a method for producing a carbon composite material of the present disclosure will be described, but the present disclosure is not limited to the following embodiment.

The carbon composite material according to the present disclosure can be produced, for example, by a method of coating inorganic particles with a carbon layer.

(Inorganic Particle)

The inorganic particles according to the present disclosure include the inorganic particles described in the above section [Inorganic Particle].

The inorganic particles of the present embodiment, when coated with a carbon layer by a CVD treatment or the like, may stably maintain its original structure during the CVD treatment or the like. Therefore, they may have high heat resistance.

The inorganic particles may be a material having a uniform structure and a uniform composition with a uniform particle size, or may be a material capable of controlling the average number of layers of the obtained graphene to 4 or less in order to obtain a high specific surface area. From such a viewpoint, the inorganic particles may be at least one selected from the group consisting of alumina, silica, magnesium oxide, tungsten carbide, aluminum nitride, and magnetic bodies such as magnetic metals, magnetic metal alloys, and magnetic oxides. In addition, from the viewpoint of improving electrical insulation performance, alumina or silica may be used, and, from the viewpoint of improving the thermal conductivity and the heat dissipation property, a magnetic body may be used, or at least one selected from the group consisting of Fe—Si—Al alloys (sendust), ferrite, and magnetite may be used.

An average particle diameter of the inorganic particles is not particularly limited, and may be from 0.0005 to 100 μm, from 0.1 to 50 μm, or from 0.5 to 20 μm. An average particle diameter of 0.0005 μm or more results in easy handling and good carbon coatability. In addition, gas permeability of a carbon source is improved when the carbon source is coated, and thus uniform carbon coating is facilitated. On the other hand, when the average particle diameter is 100 μm or less, a carbon composite material having a high specific surface area (BET specific surface area) can be obtained.

The inorganic particles may be used in admixture with a particulate spacer. By using the spacer, it is possible to secure an appropriate gap between the particles, and to prevent an increase in pressure loss due to excessively dense packing of the particles. The spacer may be a particle having an average particle diameter of, for example, from 100 to 5000 μm. The material for the spacer is not particularly limited as long as it can be sieved after carbon coating, and may be a material that does not decompose at from 900 to 1000° C.

A blending ratio of the particles to the spacer is not particularly limited, and may be, for example, from 0.1:10 to 10:10 or from 1:10 to 10:10 in terms of a mass ratio of (particles:spacer). Within this range, the carbon composite material may be obtained at a high yield.

(Coating with Carbon Layer)

The method of coating surfaces of the inorganic particles with the carbon layer is not particularly limited, and either of a wet method or a dry method can be applied. From the viewpoint of setting the average number of layers of graphene to 4 or less, a chemical vapor deposition (CVD) method or a method in which naphthalene molecules are introduced onto surfaces of inorganic particles such as silica by chemical modification, followed by firing may be used.

The CVD method used for introducing an organic compound and depositing a carbon layer on an inorganic particle is an industrial method for forming a thin film composed of a specific element or element composition (for example, a thin film composed of carbon) on a substrate such as an inorganic particle. In general, this is a technique utilizing a phenomenon in which energy is given to a gas containing a raw material by heat or light, or the raw material is converted into plasma at a high frequency, whereby the raw material is radicalized by chemical reaction or thermal decomposition to be rich in reactivity, and the raw material is adsorbed and deposited on the substrate.

The organic compound used in the CVD method may be a gas at ambient temperature or may be one that can be vaporized. The method of vaporization includes, for example, a method of heating to the boiling point or higher and a method of reducing the pressure in the atmosphere. The organic compound to be used can be appropriately selected from carbon source substances. In particular, the organic compound may be a compound that is thermally decomposed by heating, or a compound that can deposit a carbon layer on the surface of the inorganic particle.

The organic compound to be used may be an organic compound containing hydrogen, oxygen, nitrogen, boron, sulfur, phosphorus, or the like. The organic compound may be an organic compound containing an unsaturated or saturated hydrocarbon, or a mixture thereof. The organic compound to be used may be an unsaturated linear or branched hydrocarbon having a double bond and/or a triple bond, a saturated linear or branched hydrocarbon, a saturated cyclic hydrocarbon, an aromatic hydrocarbon such as benzene or toluene, or the like. As the organic compound, alcohols such as methanol and ethanol, or compounds containing nitrogen such as acetonitrile and acrylonitrile may be used. Examples of the organic compound include acetylene, methylacetylene, ethylene, propylene, isoprene, cyclopropane, methane, ethane, propane, benzene, toluene, a vinyl compound, ethylene oxide, methanol, ethanol, acetonitrile, and acrylonitrile. One type of these organic compounds may be used, or two or more types may be used in combination. Among them, the organic compound to be used may be a compound capable of entering the gap between the particles, such as acetylene, ethylene, propylene, methane, or ethane, and methane, propylene, and benzene may be used from the viewpoint of precipitating highly crystalline carbon. Methane may be used from the viewpoint of providing carbon having a high thermal decomposition temperature and high crystallinity.

The organic compound used in CVD at a higher temperature and the organic compound used in CVD at a lower temperature may be the same or different from each other. For example, acetylene, ethylene and the like may be used in CVD at a low temperature, and propylene, isoprene, benzene and the like may be used in CVD at a high temperature.

When the organic compound is introduced onto the inorganic particles, the inorganic particles may be placed under reduced pressure in advance, or the system itself may be placed under reduced pressure. Any method may be used as long as carbon is deposited by CVD. For example, carbon generated by a chemical reaction or thermal decomposition of an organic compound may be deposited (or adsorbed) on alumina nanoparticles to coat the alumina nanoparticles with a carbon layer.

A pressure at which the CVD treatment is performed is not particularly limited and may be, for example, from 1 kPa to 200 kPa or from 50 to 150 kPa. Any heating temperature condition at the time of performing the CVD treatment may be used as long as several carbon layers or less can be formed on the inorganic particles, and an appropriate temperature can be appropriately selected depending on the organic compound to be used. The heating temperature may be from 400 to 1500° C., from 450 to 1100° C., or from 550 to 950° C. For example, when propylene is used as the organic compound, the temperature may be from 700 to 900° C., and, when methane is used as the organic compound, the temperature may be from 900 to 1100° C. However, the temperature lower than the decomposition temperature of the organic compound by about from 50 to 200° C. is suitable. When heating is performed to a temperature equal to or higher than the decomposition temperature of the organic compound, vapor phase carbon deposition becomes remarkable. However, by performing the above-described method, for example, occurrence of unevenness in amount of carbon deposition between the surfaces and the inside of the inorganic particles can be prevented, and carbon can be uniformly deposited. The heating temperature can be appropriately selected depending on the CVD treatment time and/or the pressure in the reaction system. Alternatively, the product may be analyzed, and the temperature required to achieve a desired number of layers to be layered may be set based on the analysis results.

A rate of temperature increase during the CVD treatment is also not particularly limited, and may be from 1 to 50° C./min or from 5 to 20° C./min. The treatment time in the CVD treatment (CVD treatment time at a predetermined heating temperature) may be any time as long as graphene having an average number of layers of 4 or less is obtained, and an appropriate time can be selected depending on the organic compound to be used or the temperature. For example, the treatment time in the CVD treatment may be from 5 minutes to 8 hours, from 0.5 to 6 hours, or from 1 to 5 hours. Also, the product may be analyzed, and the time required for sufficient carbon deposition may be set based on the analysis results.

The CVD treatment may be performed under reduced pressure, in a vacuum, under pressure, or in an inert gas atmosphere. When the reaction is performed in an inert gas atmosphere, examples of the inert gas include nitrogen, helium, neon, and argon, and nitrogen may be used.

In the CVD method, carbon can be easily deposited or adsorbed on particles in a gas phase by heating the particles while flowing a gaseous organic compound together with a carrier gas so as to be brought into contact with the particles. The type, flow rate and flow amount of the carrier gas and the heating temperature are appropriately adjusted depending on the type of the organic compound to be used. The carrier gas is, for example, the above-described inert gases, and may be nitrogen or a mixture thereof with oxygen gas or hydrogen gas.

From the viewpoint of setting the average number of layers of graphene to 4 or less, the flow rate of the carrier gas may be, for example, from 0.05 to 1.0 m/min or from 0.32 to 0.64 m/min. An amount of the organic compound to be introduced may be from 1 to 30 vol % or from 5 to 20 vol % with respect to a total amount of the carrier gas and the organic compound.

As a method of coating the inorganic particles with the carbon layer, an organic compound may be introduced by a wet method such as an impregnation method and carbonized. Before introducing the organic compound and performing CVD, the organic compound may be impregnated and carbonized. As the organic compound to be impregnated, for example, a thermally polymerizable monomer such as furfuryl alcohol having a high carbonization yield can be used. As a method for impregnating the inorganic particles with the organic compound, there can be employed known means such as bringing the inorganic particles into contact with the organic compound as it is or in a state in which the organic compound is mixed with a solvent if the organic compound is a liquid, or dissolved in a solvent if the organic compound is a solid.

After the first step, the carbon-coated inorganic particles may be subjected to a heat treatment to carbonize the carbon layer, and highly crystalline carbon may be deposited on the surfaces of the inorganic particles. In this way, the resulting carbon composite material has higher crystallinity and a higher specific surface area.

Since the carbonization of the carbon layer can also proceed by the CVD treatment, the heat treatment may be performed at the time of the CVD treatment or may be performed by another method.

The heat treatment method is not particularly limited, and the heat treatment may be performed using a high-frequency induction heating furnace or the like.

By the above method, it is possible to obtain a core-shell particle and a core-shell connected body in which surfaces of inorganic particles are coated with a coating layer composed of graphene having an average number of layers of 4 or less, that is, a carbon composite material.

[Method for Producing Electromagnetic Interference Suppressing Material]

The electromagnetic interference suppressing material of the present disclosure may be obtained by sufficiently uniformly mixing a carbon composite material with any other component to be blended as necessary using a mixer or the like, and then performing a kneading process with a disperser, a kneader, a three roll mill, a twin-screw heating roll, a twin-screw heating extruding kneader, or the like. The kneading process may be implemented with heating. The temperature when heating may be from 70° C. to 150° C. or from 75° C. to 120° C.

After the kneading process, the electromagnetic interference suppressing material of the present disclosure may be, for example, cooled and solidified, pulverized to an appropriate size using a cutting mill, a ball mill, a cyclone mill, a hammer mill, a vibration mill, a cutter mill, a grinder mill, a speed mill, or the like, and then used.

The mixture obtained after the kneading process may be pressed and molded into a sheet shape in a molding machine at a temperature of from 50° C. to 100° C. and a pressure of from 0.5 MPa to 1.5 MPa.

The electromagnetic interference suppressing material of the present disclosure can be used as a radio wave absorbing material, a noise suppression sheet, a semiconductor sealing material, a sealing sheet, an electric wire covering material, or the like.

As an embodiment of the present disclosure, for example, a resin-sealed electronic component can be obtained by sealing a semiconductor element fixed on a substrate with a semiconductor element sealing material containing the electromagnetic interference suppressing material of the present disclosure.

Note that a known molding method can be used without particular limitation to produce an electronic component. The most common molding method is low pressure transfer molding, but the molding can also be implemented by injection molding, cast molding, compression molding, and the like.

For example, when the transfer molding method is used, a heating treatment is implemented in a molding die using a transfer molding machine at a temperature of from 150° C. to 200° C. for a time of from 20 seconds to 200 seconds, a molded article is removed from the molding die, and the molded article is subjected to a heating treatment at a temperature of from 150° C. to 200° C. for 2 hours to 12 hours to complete the curing.

When the compression molding method is used, first, a substrate on which a semiconductor element is mounted is supplied to an upper mold of a mold die, and the electromagnetic interference suppressing material of the present disclosure is supplied into a cavity of a lower mold. Subsequently, the upper and lower molds are clamped at a required mold clamping force, and thereby the substrate on which the semiconductor element is mounted is immersed into the electromagnetic interference suppressing material heated and melted inside the cavity of the lower mold. Afterwards, the electromagnetic interference suppressing material heated and melted inside the lower mold cavity is pressed by a cavity bottom surface member, a required pressure is applied under reduced pressure, and the resin composition is compression molded. The molding conditions may include a temperature of from 120° C. to 200° C. and a pressure of from 2 MPa to 20 MPa.

EXAMPLES

The present disclosure will be specifically described through examples; however, the present disclosure is not limited in any way to these examples.

[Production of Carbon Composite Material]

The details of the inorganic particles as presented in Tables 1 and 2 used in the production of the carbon composite material are as follows.

- Silica: SO—C1; available from Admatechs Co., Ltd., average particle diameter: 0.3 μm
- Alumina: Puralox SBa-200; available from Sasol Ltd., average particle diameter (primary particle size): 7 nm
- Mesoporous silica: SBA-15 (prepared by the method which will be described below)
- Magnesium oxide: available from EM Japan Co., Ltd., average particle diameter (primary particle size): 10 nm
- Sendust (Fe—Si—Al alloy): Sanyo Special Steel Co., Ltd., average particle diameter: 40 μm, flat shape
- Ferrite (Mn—Zn based): Powdertech Co., Ltd., average particle diameter: from 5 to 10 μm

Production Example 1

In 5 ml of acetone, 2.3 g of 2,3-dihydroxynaphthalene (DN) was dissolved, and 0.47 g of dried silica (SO—C1) was added thereto to obtain a mixed liquid. The mixed liquid was stirred at room temperature for 2 hours and then acetone was evaporated at 95° C. The residue of the mixture of DN and silica was heat-treated at 573° C. under a nitrogen gas stream for 1 hour to react the silica surface with DN, and then heat-treated at 800° C. under a nitrogen gas stream for 4 hours to obtain carbon-coated silica particles (A-1).

Production Example 2

Alumina (Puralox SBa-200) and quartz sand (available from SendaiWako Pure Chemical, Ltd.) as a spacer were mixed at a mass ratio of 3:20 (alumina nano: quartz sand). The silica sand used was silica sand soaked in 1 M hydrochloride for 12 hours, heated at 800° C. for 2 hours in air in a muffle oven, and sieved at intervals of 180 μm. The mixture of alumina and silica sand prepared above was placed in a reaction tube (internal diameter: 37 mm), and chemical vapor deposition CVD using methane as a carbon source (methane CVD) was carried out. To be more specific, under the condition that the flow rate of N2 gas was adjusted to 224 ml/min, the mixture of alumina and silica sand prepared above was heated from room temperature to 900° C. at a rate of temperature increase of 10° C./min and held at 900° C. for 30 minutes. Then, N2 gas (carrier gas) and methane gas were introduced into the reaction tube, and chemical vapor deposition (CVD) treatment was performed at 900° C. for 2 hours. When the N2 gas and the methane gas were introduced into the reaction tube, the amount of the methane gas was adjusted to 20 vol % with respect to the total amount of the N2 gas and the methane gas, the flow rate of the methane gas was adjusted to 45 ml/min, and the flow rate of the N2 gas was adjusted to 179 ml/min. After the CVD treatment, the introduction of the methane gas was stopped, and, under the condition that the flow rate of the N2 gas was adjusted to 224 ml/min, the alumina nanoparticles were retained at 900° C. for 30 minutes and then cooled to obtain carbon-coated alumina particles (A-2).

Production Example 3

Mesoporous silica (SBA-15) was prepared by a sol-gel method. Specifically, it was prepared by the following method. First, 15 g of a surfactant (P-123) was dissolved in 360 mL of pure water using a 500 ml beaker, and 33 g of tetraethoxysilane (TEOS) was added thereto, followed by stirring for 5 minutes. Subsequently, 60 mL of 36 mass % hydrochloric was added dropwise over 30 minutes, and the mixture was stirred at 35° C. for 20 hours and then at 95° C. for 24 hours. The obtained white precipitate was dried at 80° C. for 12 hours and then fired at 550° C. for 6 hours in air to obtain SBA-15.

Subsequently, carbon-coated silica particles (A-3) were obtained by the same operation as in Production Example 1 except that mesoporous silica (SBA-15) was used as the inorganic particles instead of silica.

Production Example 4

Carbon-coated magnesium oxide particles (A-4) were obtained by the same operation as in Production Example 2 except that magnesium oxide was used as the inorganic particles instead of alumina.

Production Example 5

For the purpose of increasing the crystal order and forming an oxide layer of Si and Al on the surface, the sendust was heated at 700° C. for 5 hours in an Ar atmosphere and then heated at 150° C. for 5 hours in the atmosphere.

Subsequently, carbon-coated sendust particles (A-5) were obtained by the same operation as in Production Example 1 except that the obtained sendust was used as the inorganic particles instead of silica.

Production Example 6

Carbon-coated ferrite particles (A-6) were obtained by the same operation as in Production Example 2 except that ferrite was used as the inorganic particles instead of alumina.

[Measurement Evaluation of Carbon Composite Material]

The obtained carbon composite materials were subjected to measurement evaluation for the following items. The measurement evaluation results are summarized in Table 1.

<Average Number of Layers of Graphene>

From the specific surface area and amount of carbon supported determined by the above-described methods, the average number of layers of graphene was determined by the following formula.

Average number of layers of graphene=amount of carbon supported per area ($g/m^2$)/(mass of graphene per area [$g/m^2$])

The "amount of carbon supported per area ($g/m^2$)" is a value obtained by dividing the amount (g) of carbon supported of the carbon composite material per mass as determined by the method described above by the specific surface area ($m^2/g$) of the inorganic particle contained in the core-shell particle or the core-shell connected body.

<Carbon Content Rate (Graphene Content Rate)>

The carbon content rate of the carbon composite material was determined by the following formula:

Carbon content rate (%)=carbon area density of graphene ($g/m^2$)×specific surface area of inorganic particles contained in core-shell particles or core-shell connected body ($m^2/g$)×average number of layers of graphene Note that the carbon area density of graphene was $7.61\times10^{-4}$ $g/m^2$.

TABLE 1

| | Type | Inorganic particle | BET specific surface area [$m^2/g$] | Average number of layers of graphene | Carbon content rate [mass %] |
|---|---|---|---|---|---|
| Production Example 1 | A-1 | Silica | 10 | 1 | 0.8 |
| Production Example 2 | A-2 | Alumina | 230 | 1.2 | 21 |
| Production Example 3 | A-3 | Mesoporous silica | 770 | 1.1 | 64 |
| Production Example 4 | A-4 | Magnesium oxide | 63 | 1 | 5 |
| Production Example 5 | A-5 | Sendust | 1 | 3 | 0.2 |
| Production Example 6 | A-6 | Mn/Zn ferrite | 0.5 | 3 | 0.1 |

<Specific Surface Area (BET Specific Surface Area)>

The obtained carbon composite material was dried by vacuum heating at 150° C. for 6 hours, and then the specific surface area was determined by a multipoint (5 points) method from a nitrogen adsorption isotherm measured using a high-precision automatic gas/vapor adsorption amount measuring device "BEL SORP MAX" (available from Bel Japan, Inc.).

<Amount of Carbon Supported (Carbon Content in Carbon Composite Material)>

The amount of carbon supported of the obtained carbon composite material was measured using a simultaneous thermogravimetry/differential thermal analyzer "DTG-60/60H" (available from Shimadzu Corporation). To be specific, while the mass of the obtained carbon composite material was measured, the material was subjected to a temperature increase to 120° C. at 10° C./min under a synthetic air flow (50 cc/min), held for 30 minutes, then subjected to a temperature increase to 800° C. at 5° C./min, held for 1 hour, cooled to 120° C. at −10° C./min, and held for 30 minutes. The amount of carbon supported per mass was determined from a difference between the average mass when the carbon composite material was held at 800° C. before being heated to 120° C. and the average mass when it was held at 800° C. after being heated to 120° C.

[Production of Electromagnetic Interference Suppressing Material]

The details of the components presented in Table 2 used in the production of the electromagnetic interference suppressing materials are as follows.

[Organic Substance]

- Epoxy resin: EPICLON N670; cresol novolac-type epoxy resin; available from DIC Corporation, epoxy equivalent: 210
- Phenol resin: PC-25; Sumitomo Bakelite Co., Ltd.
- Curing agent: BRG-557; phenol novolac resin; available from Aica Kogyo Co., Ltd.
- Curing accelerator: Curezol C17Z; imidazole compound; available from Shikoku Chemicals Corporation
- Flame retardant: Rabitle (phosphazene-based flame retardant) FP100; available from Mitsui Fine Chemicals, Inc.
- Ethylene-ethyl acrylate copolymer: MB-870; available from Nippon Unicar Company Limited
- Lubricant: stearic acid; available from NOF Corporation

[Inorganic Substance]

- Silica: FB105; available from Denka Co., Ltd., average particle diameter: 12 μm
- Alumina: DAW07; available from Denka Co., Ltd., average particle diameter: 8 μm, maximum particle diameter: 50 μm

[Carbon Material]

Carbon black (CB): TPK1227R; available from Cabot Corporation, average particle diameter: 0.1 μm Carbon nanotubes (CNT): LUCAN; available from LG Chem Ltd., average fiber length: 30 μm, average fiber diameter: 0.02 μm, aspect ratio: 1500

[Others]

Fe-based alloy powder: Fe content? 95 wt % (remainder Si, Cr), BET specific surface area: 5 $m^2/g$ Examples 1 to 7 and Comparative Examples 1 to 3

Each component of the type and blending amount presented in Table 2 was inserted into a Henschel mixer and mixed, after which the mixture was inserted into a twin-screw kneader heated to 110° C., and the mixture was heated and kneaded until becoming uniform. The heated and kneaded product was inserted into a cold roll, extended into a sheet shape, and then pulverized, and an electromagnetic interference suppressing material composition was produced. The obtained electromagnetic interference suppressing material composition was compression-molded into a molded body having a thickness of 0.5 mm, 1.0 mm or 25 mm (temperature: 175° C., pressure: 10 MPa) to obtain an electromagnetic interference suppressing material.

Examples 8 to 10

The components of the types and blending amounts presented in Table 2 were extruded into a 0.5 mmt tube by an extruder heated to 180° C. The extruded product was rolled into a plate by a rolling machine to obtain an electromagnetic interference suppressing material composition. The obtained electromagnetic interference suppressing material composition was compression-molded into a molded body having a thickness of 0.5 mm, 1.0 mm or 25 mm (temperature: 190° C., pressure: 15 MPa) to obtain an electromagnetic interference suppressing material.

Example 11

After 56 parts by mass of the carbon-coated alumina particles (A-2) obtained in Production Example 2 and 104 parts by mass of a mixed solution containing a phenolic resin, methanol, and acetone (solid concentration: 43%) were mixed, a 0.15 mm thick sheet was formed by a doctor-blade method. A plurality of the sheets was layered and pressed, and then subjected to a heating treatment at 150° C. for 2 hours to obtain a 0.5 mm thick sheet sample (20 mm×20 mm).

Example 12

A sheet sample was obtained by the same operation as in Example 11, except that a 0.9 mm thick sheet sample (20 mm×20 mm) was obtained by forming a 0.15 mm thick sheet by the doctor-blade method, and layering and pressing a plurality of the sheets, followed by a heating treatment at 150° C. for 2 hours.

Comparative Example 4

After 70 parts by mass of Fe-based alloy powder and 150 parts by mass of a mixed solution containing a phenolic resin, methanol, and acetone (solid concentration: 43%) were mixed, a 0.15 mm thick sheet was formed by a doctor-blade method. A plurality of the sheets was layered and pressed, and then subjected to a heating treatment at 150° C. for 2 hours to obtain a 0.5 mm thick sheet sample (20 mm×20 mm).

TABLE 2

| | Composition [parts by mass] | | | | | | | |
|---|---|---|---|---|---|---|---|---|
| | Base material | | | | | | | |
| | Organic substance | | | | | | Inorganic substance | |
| | Thermosetting resin Epoxy resin | Curing agent Phenolic resin | Curing accelerator Imidazole | Flame retardant Phosphazene | Thermoplastic resin Ethylene-ethyl acrylate copolymer | Lubricant Stearic acid | Silica | Alumina |
| Example 1 | 13.4 | 6.2 | 0.4 | 10 | — | — | 60 | — |
| Example 2 | 13.4 | 6.2 | 0.4 | 10 | — | — | 60 | — |
| Example 3 | 13.4 | 6.2 | 0.4 | 10 | — | — | 50 | — |
| Example 4 | 13.4 | 6.2 | 0.4 | 10 | — | — | 60 | — |
| Example 5 | 13.4 | 6.2 | 0.4 | 10 | — | — | 60 | — |
| Example 6 | 13.4 | 6.2 | 0.4 | 10 | — | — | — | — |
| Example 7 | 13.4 | 6.2 | 0.4 | 10 | — | — | — | 127 |
| Example 8 | 13.4 | 6.2 | 0.4 | 10 | — | — | 30 | — |
| Example 9 | 13.4 | 6.2 | 0.4 | 10 | — | — | — | — |
| Example 10 | — | — | — | — | 30 | 0.1 | 60 | — |
| Comparative Example 1 | 13.4 | 6.2 | 0.4 | 10 | — | — | 70 | — |

TABLE 2-continued

| | | | | | | | | |
|---|---|---|---|---|---|---|---|---|
| Comparative Example 2 | 13.4 | 6.2 | 0.4 | 10 | — | — | 70 | — |
| Comparative Example 3 | 13.4 | 6.2 | 0.4 | 10 | — | — | — | 127 |

| | Composition [parts by mass] | | | | | | | |
|---|---|---|---|---|---|---|---|---|
| | Carbon composite material | | | | | | | |
| | A-1 Silica | A-2 Alumina | A-3 Mesoporous silica | A-4 Magnesium oxide | A-5 Sendust | A-6 Ferrite | CB | CNT |
| Example 1 | 10 | — | — | — | — | — | — | — |
| Example 2 | — | 18 | — | — | — | — | — | — |
| Example 3 | — | 36 | — | — | — | — | — | — |
| Example 4 | — | — | 10 | — | — | — | — | — |
| Example 5 | — | — | — | 16 | — | — | — | — |
| Example 6 | — | — | — | — | 270 | — | — | — |
| Example 7 | 10 | — | — | — | — | — | — | — |
| Example 8 | 30 | — | — | — | 102 | — | — | — |
| Example 9 | — | — | — | — | — | 196 | — | — |
| Example 10 | — | 18 | — | — | — | — | — | — |
| Comparative Example 1 | — | — | — | — | — | — | 1 | — |
| Comparative Example 2 | — | — | — | — | — | — | — | 1 |
| Comparative Example 3 | — | — | — | — | — | — | 1 | — |

[Measurement Evaluation of Electromagnetic Interference Suppressing Material]

The electromagnetic interference suppressing materials obtained in Examples 1 to 10 and Comparative Examples 1 to 3 were subjected to measurement evaluation of thermal conductivity, thermal expansion coefficient, volume resistance (volume resistivity), electromagnetic wave absorption performance (frequency: 10 GHz, near field measurement system), and electromagnetic wave absorption performance (frequency: 5 GHz, far field measurement system). The measurement evaluation results are summarized in Table 3.

The sheet samples (electromagnetic interference suppressing materials) obtained in Examples 11 and 12 and Comparative Example 4 were subjected to measurement evaluation of surface resistance, transmission attenuation ratio (Rtp), and voltage standing wave ratio (VSWR). The measurement evaluation results are summarized in Table 4.

<Thermal Conductivity>

One surface of each of the electromagnetic interference suppressing materials as 1.0 mm thick molded bodies obtained in the Examples was irradiated with laser light to give heat flow energy whose intensity was periodically modulated. A phase difference of a temperature response on the other surface of the molded body was detected using a temperature sensor, a thermal diffusivity and a specific heat were obtained, and a thermal conductivity was calculated.

<Thermal Expansion Coefficient>

By a TMA method using each of the electromagnetic interference suppressing materials as 1.0 mm thick molded bodies obtained in the Examples, the temperature was increased from room temperature (25° C.) to 300° C. at a rate of temperature increase of 5° C./min using a thermal analyzer "SSC/5200" (available from Seiko Instruments Inc.), and an inclination of the portion closest to the straight line at from 25 to 60° C. from the obtained TMA chart was taken as the thermal expansion coefficient.

<Volume Resistance (Volume Resistivity)>

The volume resistance at 150° C. was measured according to JIS K-6911:2006 using each of the electromagnetic interference suppressing materials as 1.0 mm thick molded bodies obtained in the Examples.

<Electromagnetic Wave Absorption Performance (Frequency: 10 GHz, Near Field Measurement System)>

An electromagnetic interference suppressing material molded into a thickness of 0.5 mm was installed between a high-frequency oscillating device and a reception antenna. The electromagnetic wave intensity when electromagnetic waves having a frequency of 10 GHz were generated was measured for both a case in which the molded body was present and a case in which the molded body was not present. The ratio of the electromagnetic wave intensities of both cases ((electromagnetic wave intensity when electromagnetic waves were absorbed by the electromagnetic interference suppressing material)/(electromagnetic wave intensity when the electromagnetic interference suppressing material was not present)) was then expressed in units of dB and used as electromagnetic wave-absorption performance.

Note that the electromagnetic wave intensity was measured in accordance with the "IEICE Transactions on Fundamentals of Electronics, Communications, and Computer Sciences B, Vol. J97-B, No. 3, pp. 279-285".

<Electromagnetic Wave Absorption Performance (Frequency: 5 GHz, Far Field Measurement System)>

A 1 mm thick copper plate (600 mm×600 mm) was placed on an antireflection radio wave absorber, and a 25 mm thick electromagnetic interference suppressing material (440 mm×440 mm) was placed on a metallic plate. Next, an antenna was attached to a network analyzer via a cable, and electromagnetic waves having a frequency of 5 GHz were transmitted from one antenna, reflected by the electromagnetic interference suppressing material and the metallic plate placed below the electromagnetic interference suppressing material or radio wave absorber, and received by the other antenna to measure the electromagnetic wave intensity. In addition, the electromagnetic interference suppressing material was not placed on the metallic plate, and electromagnetic waves were radiated by the same method as described above to measure the electromagnetic wave intensity. The ratio (electromagnetic wave intensity when electromagnetic waves were absorbed by the electromagnetic interference suppressing material/electromagnetic wave intensity when the electromagnetic interference suppressing material was not present) was defined as electromagnetic wave absorption performance in the units of dB.

The electromagnetic wave intensity was measured in accordance with "Reports of Kagoshima Prefectural Institute of Industrial Technology, No. 15 (2001), pp 53-61".

<Surface Resistance>

In accordance with JIS K-6911:2006, the surface resistance was measured with a probe of an ohmmeter at a distance of 1 cm.

<Transmission Attenuation Rate (Rtp) and Voltage Standing Wave Ratio (VSWR)>

The Rtp and the voltage standing wave ratio (VSWR) of the sheet sample at the frequencies presented in Table 4 were measured in accordance with the IEC 62333-2 Transmission Attenuation Ratio measurement method, except that the microstrip line used in the method was replaced with a coplanar line having a line width of 0.6 mm.

TABLE 3

| | Carbon content rate*1 | Thermal conductivity | Thermal expansion coefficient | Volume resistance | Evaluation of electromagnetic interference suppression Electromagnetic wave absorption performance [dB] | |
|---|---|---|---|---|---|---|
| | [mass %] | [W/mK] | [ppm/deg] | [Ω · cm] | 10 GHz*2 | 5 GHz*3 |
| Example 1 | 0.1 | 1.5 | 17 | $1.0 \times 10^{13}$ | 15 | 5 |
| Example 2 | 3.0 | 2.0 | 18 | $1.0 \times 10^{13}$ | 18 | 6 |
| Example 3 | 5.7 | 4.0 | 19 | $1.0 \times 10^{12}$ | 25 | 6 |
| Example 4 | 5.5 | 3.0 | 17 | $1.0 \times 10^{12}$ | 28 | 7 |
| Example 5 | 0.7 | 2.2 | 18 | $1.0 \times 10^{13}$ | 28 | 7 |
| Example 6 | 0.2 | 5.0 | 22 | $1.0 \times 10^{4}$ | 30 | 10 |
| Example 7 | 0.8 | 5.0 | 21 | $1.0 \times 10^{13}$ | 16 | 6 |
| Example 8 | 0.1 | 4.0 | 21 | $1.0 \times 10^{6}$ | 30 | 10 |
| Example 9 | 0.1 | 5.0 | 22 | $1.0 \times 10^{6}$ | 30 | 10 |
| Example 10 | 3.5 | 1.4 | 19 | $1.0 \times 10^{9}$ | 10 | 4 |
| Comparative Example 1 | 0.8 | 0.7 | 17 | $1.0 \times 10^{14}$ | 3 | 0 |
| Comparative Example 2 | 0.8 | 1.0 | 17 | 30 | 20 | 2 |
| Comparative Example 3 | 0.6 | 5.0 | 21 | $1.0 \times 10^{14}$ | 3 | 0 |

*1This represents a carbon content rate in the electromagnetic interference suppressing material. When the electromagnetic interference suppressing material contains a carbon composite material, the carbon content rate means a graphene content rate.
*2Near field measurement system
*3Far field measurement system

TABLE 4

| | Sheet thickness | Volume resistance | Rtp [dB] | | | VSWR | | |
|---|---|---|---|---|---|---|---|---|
| | [mm] | [Ω · cm] | 3 GHz | 30 GHz | 45 GHz | 3 GHz | 30 GHz | 45 GHz |
| Example 11 | 0.5 | 350 | 1 | 20 | 23 | 1.4 | 1.1 | 1.1 |
| Example 12 | 0.9 | 300 | 1 | 24 | 30 | 1.4 | 1.1 | 1.1 |
| Comparative Example 4 | 0.5 | $1 \times 10^{6}$ | 3 | 23 | 19 | 1.3 | 1.4 | 1.4 |

As presented in Table 3, the electromagnetic interference suppressing materials of Examples 1 to 10 have good radio wave absorption performance. In addition, because of their high volume resistance, their electromagnetic interference suppression performance in the near field can be said to be good. They also have a high thermal conductivity.

As presented in Table 4, in the sheet samples of Examples 11 and 12, the Rtp at 3 GHz was small, while the Rtp at 30 GHz and the Rtp at 45 GHz were large values exceeding 20 dB. On the other hand, in the sheet sample of Comparative Example 4, the Rtp at 3 GHz was larger than those of the sheet samples of Examples 11 and 12, and the Rtp at 45 GHz was smaller than those of the sheet samples of Examples 11 and 12.

The voltage standing wave ratio (VSWR) of each sample was 1.5 or less, but the values thereof at 30 GHz and 5 GHz of the sheet samples of Examples 11 and 12 were very small values, i.e., 1.1.

From the above results, it can be said that the sheet samples of Examples 11 and 12 are excellent in frequency-selectivity and exhibit a high electromagnetic interference suppression effect without deterioration of VSWR in a high-frequency region of 30 GHz or higher.

Therefore, it can be said that the configuration of the present disclosure is an effective means for suppressing electromagnetic interference generated in a micro-wave band (3 GHz to 30 GHz) and a high-frequency region exceeding 30 GHz, and is effective as a high-frequency noise suppression sheet for use in a near field such as inside a cellular phone.

The invention claimed is:

1. An electromagnetic interference suppressing material comprising: a base material comprising at least one selected from the group consisting of an organic substance and an inorganic substance; and a carbon composite material, wherein the carbon composite material comprises at least one selected from the group consisting of a core-shell particle and a core-shell connected body, the core-shell particle comprising an inorganic particle in which a surface of the inorganic particle is coated with a coating layer composed of graphene having an average number of layers of 4 or less, and the core-shell connected body comprising a connected body of inorganic particles in which a surface of the connected body of inorganic particles is coated with a coating layer of graphene having an average number of layers of 4 or less, and the electromagnetic interference suppressing material has a volume resistance of $10^3$ Ω·cm or more.

2. The electromagnetic interference suppressing material according to claim 1, wherein an average particle diameter of the inorganic particle contained in the core-shell particle and the inorganic particles contained in the core-shell connected body is 100 μm or less.

3. The electromagnetic interference suppressing material according to claim 1, wherein a graphene content in the electromagnetic interference suppressing material is from 0.001 to 30 mass % with respect to a total amount of the electromagnetic interference suppressing material.

4. The electromagnetic interference suppressing material according to claim 1, wherein the inorganic particle contained in the core-shell particle and the inorganic particles contained in the core-shell connected body comprise at least one selected from the group consisting of alumina, silica, magnesium oxide, tungsten carbide, and aluminum nitride.

5. The electromagnetic interference suppressing material according to claim 1, wherein the inorganic particle contained in the core-shell particle and the inorganic particles contained in the core-shell connected body are magnetic bodies.

6. The electromagnetic interference suppressing material according to claim 5, wherein the magnetic bodies comprise at least one selected from the group consisting of a magnetic metal, a magnetic metal alloy, and a magnetic oxide, wherein the magnetic oxide is at least one selected from the group consisting of ferrite and magnetite.

7. The electromagnetic interference suppressing material according to claim 6, wherein the magnetic metal has a flat shape.

8. The electromagnetic interference suppressing material according to claim 1, wherein the organic substance is a thermosetting resin.

9. The electromagnetic interference suppressing material according to claim 1, wherein the organic substance is a thermoplastic resin.

10. The electromagnetic interference suppressing material according to claim 1, wherein the inorganic substance is a ceramic.

* * * * *